… … … US005512765A

United States Patent [19]
Gaverick

[11] Patent Number: 5,512,765
[45] Date of Patent: Apr. 30, 1996

[54] EXTENDABLE CIRCUIT ARCHITECTURE

[75] Inventor: Timothy L. Gaverick, Cupertino, Calif.

[73] Assignee: National Semiconductor Corporation, Santa Clara, Calif.

[21] Appl. No.: 190,910

[22] Filed: Feb. 3, 1994

[51] Int. Cl.$^6$ .......................... H01L 27/10; H01L 23/053
[52] U.S. Cl. .......................... 257/202; 257/203; 257/208; 257/209; 257/700; 437/48; 365/226; 326/41
[58] Field of Search .................................... 257/202, 203, 257/208, 209, 778, 777, 786, 685, 690, 723, 700; 307/465; 437/48; 365/226

[56] References Cited

U.S. PATENT DOCUMENTS

| 4,221,047 | 9/1980 | Narken et al. | 257/700 |
| 5,239,510 | 8/1993 | Hill | 365/226 |
| 5,275,962 | 1/1994 | Hashimoto | 437/48 |
| 5,298,805 | 3/1994 | Garverick et al. | 307/465 |

FOREIGN PATENT DOCUMENTS

| 0475269 | 3/1992 | European Pat. Off. | 257/700 |
| 0592111A2 | 4/1994 | European Pat. Off. | 307/465 |

OTHER PUBLICATIONS

Dobbelaere, I. et al. "*Field Programmable MCM Systems—Design of an Interconnection Frame,*" Mar. 5, 1992 pp. 461–464, Proceedings of the IEEE 1992 Custom Integrated Circuits Conference, Boston, May 3–6, 1992.

Technology Products, *C4 Product Design Manual*, "vol. I: Chip and Wafer Design," pp: cover, iii through xii, 1–1 through 10–6, and A–1 through A–12, from IBM.

Primary Examiner—Steven H. Loke
Attorney, Agent, or Firm—Limbach & Limbach

[57] ABSTRACT

A high functional capacity semiconductor based system for which the semiconductor material cost increases substantially linearly with functional capacity. The device is manufactured by taking individual, lower functional capacity devices having an extendible architecture and utilizing them in a high interconnect packaging method such as flip-chip technology. Multiple individual chips are interconnected into a single, larger device by means of this packaging technique. Because each individual chip is extendible, the resulting larger capacity device has substantially the same architecture as the smaller devices from which it is made. This means that the final device is essentially equivalent to a higher capacity single device based on the architecture of the smaller component devices. In a preferred embodiment of the invention, the result is a high capacity programmable gate array having a semiconductor cost which increases substantially linearly with the number of gates, and which uses a straightforward extension of the development tools used for application designs based on the individual chips.

9 Claims, 11 Drawing Sheets

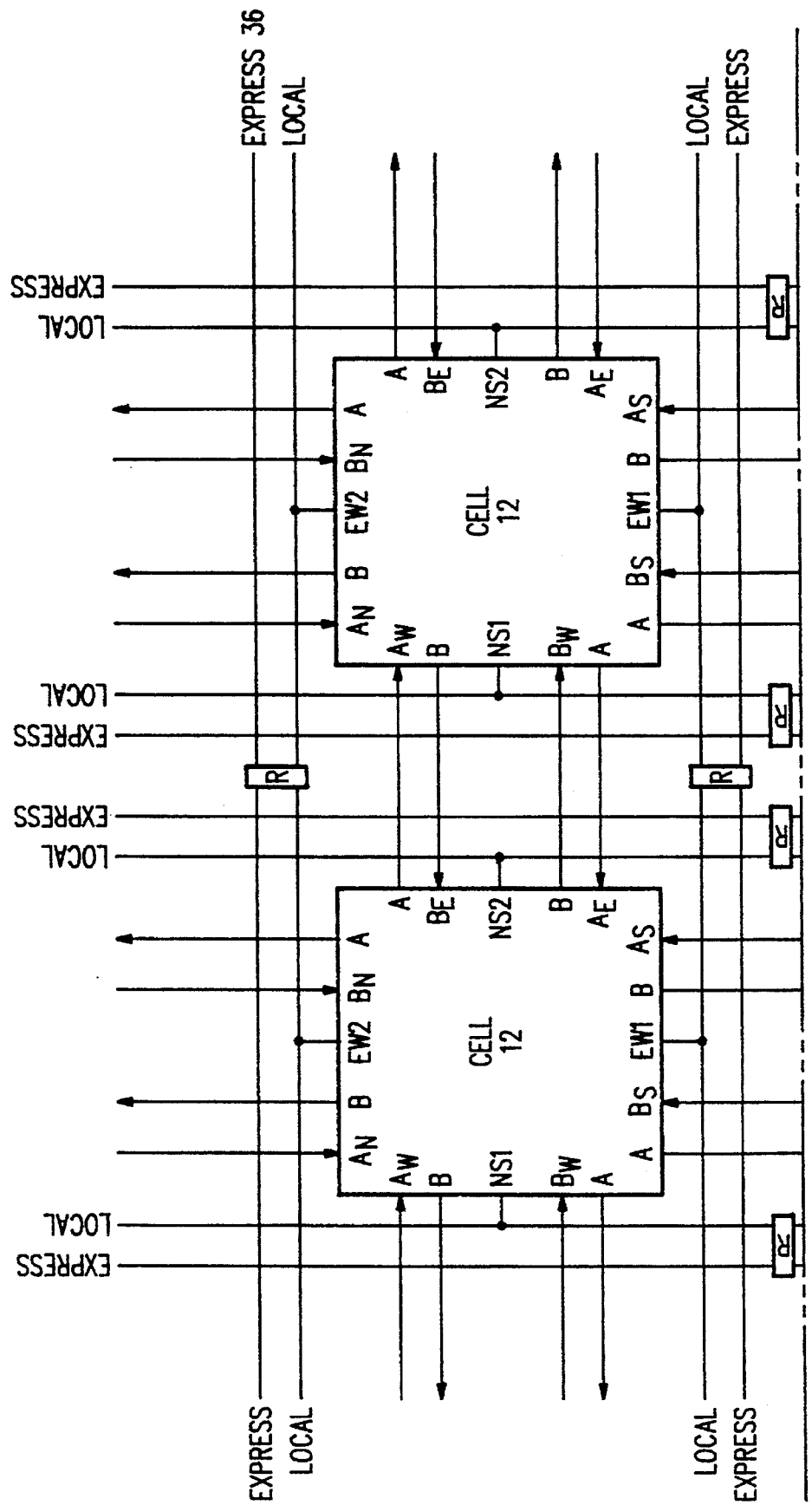
FIG. 2C(1)

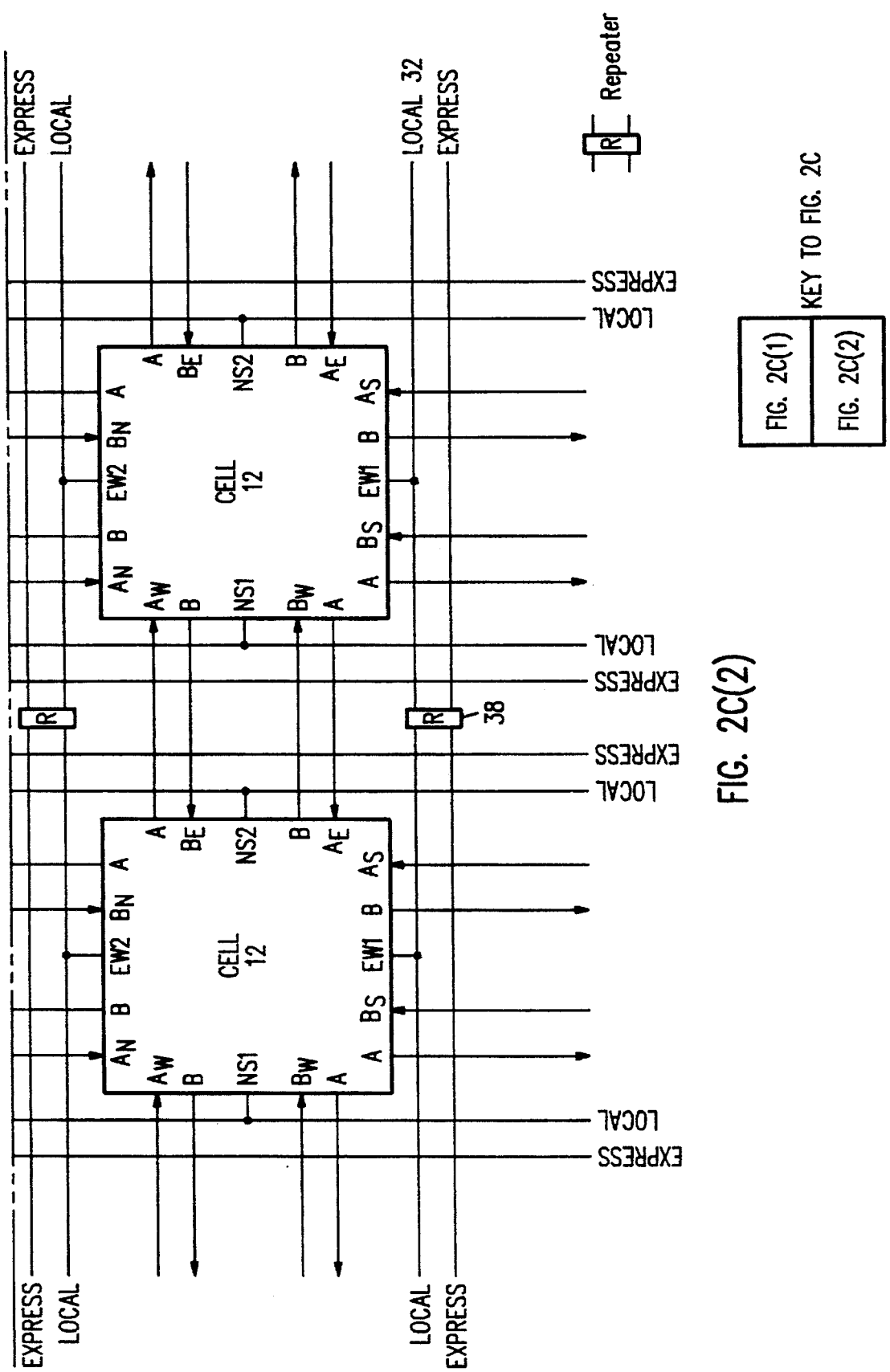

EXTENDABLE CIRCUIT ARCHITECTURE

TECHNICAL FIELD

The present invention is generally directed to semiconductor devices having a large number of programmable elements, and more specifically, to a high density programmable module that utilizes an extendible architecture so that the cost of the semiconductor material used in manufacturing the module increases linearly with an increase in programmable element capacity.

BACKGROUND OF THE INVENTION

The cost of the semiconductor material used to fabricate an integrated circuit device having a high capacity of logic gates is a function of the yield (Y) of a particular fabrication process. The yield is a function of the area (A) of the die which forms the basis for the device and the defect density (DD) of the fabrication process. If the defects generated during the fabrication process are assumed to be random and as having a Poisson distribution, the following formula for the yield is obtained:

$$Y = e^{-(DD*A)} \quad (1)$$

Based on these assumptions, the cost of manufacturing the semiconductor material increases exponentially with an increase in the die area.

Given that the die area required to implement a single gate is fixed, gate capacity will vary linearly with die area. Therefore, based on the yield formula given above, the cost of manufacturing the semiconductor materials increases at a rate greater than that at which the number of logic gates increases.

The non-linear increase of the semiconductor cost as a function of the gate capacity means that the cost of fabricating complex devices can quickly become prohibitively expensive for many applications. This creates a strong disincentive to using high gate capacity devices, even for applications which might benefit from such use.

For example, if a device having 60K (thousand) programmable logic gates is to be made on a single die using a 0.8 micron CMOS process, a square die approximately 2.5 cm on a side would be required. This die has a surface area of 6.25 cm², and based on the yield formula given in equation (1) and an assumed defect density of 1 per cm², the yield would be about 0.002 or 0.2%. Assuming 16 gross die per six inch diameter wafer and that such a wafer of silicon costs approximately $1,000 when fully processed, this yield gives a cost per die of approximately $31,250. If a defect density of 0.5 per cm² is used, the yield obtained from equation (1) increases to 4.4%. This yield gives a cost per die of approximately $1,420. However, even with the increased yield which results from the lower defect density, the cost of the processed silicon required to fabricate the 60 k device may still be too much for some applications which would benefit from the increased gate capacity.

The high cost of the silicon used in making a single high capacity chip has provided the motivation for developing alternative ways of fabricating high gate capacity devices. One of these alternatives is based on Multi-Chip Module (MCM) packaging technology. MCM technology combines two or more individual chips into a single package which is capable of performing more complex functions than a single chip. The individual chips are mounted on a common substrate and connected to each other and to the package contacts by one of several methods, for example, wire bonding or solder bump technology. In the case of programmable logic devices, the number of interconnections between the chips has a significant impact on the degree of utilization (the ratio of gates used to gates available) that can be achieved for a given application. This is important because it determines how effectively the chips function as a single unit and the complexity of the functions which the combination of chips can perform.

Wire bonding is commonly used in MCM packages to connect the chips to a common substrate because the chips which are usually combined into a MCM package are of the type which are meant to be used individually, and hence are designed to be mounted using wire bonding. However, wire bonding has several disadvantages when used in MCM packages:

(1) the density of the interconnections between a chip and the substrate and between individual chips is constrained by the physical space available for the wires, thereby limiting the number of interconnections possible; (2) the number of interconnections must be limited in order to prevent short circuits; and (3) capacitive and inductive coupling between the leads can impact performance.

Another method for mounting individual chips to a common substrate is to use solder bump, or flip-chip technology. In this method, solder bumps are placed on the die and the chip is flipped over, placing the solder bumps in contact with conductive pads on the substrate. The solder is then reflowed, establishing a good electrical contact. The individual chips are interconnected using an interconnect network on or within the substrate.

An example of a MCM technology which is suited for applications requiring a high interconnect density between the individual chips and which uses such an interconnect network is Area Array technology. In this packaging method, connections are made from the interior of one chip to another through a multi-layer MCM substrate. The interconnect layers of the substrate are accessed through arrays of conductive pads which are designed to correspond to the positions of the metal bumps on chips used in flip-chip packaging methods. The metal bumps are soldered to the array pads to electrically connect the chips to each other.

While the flip-chip mounting method minimizes the chip-to-chip spacing and significantly reduces the likelihood of a short circuit and the magnitude of capacitive and inductive coupling, it does not resolve a problem common to both wire bonding and flip-chip mounting technologies. This problem relates to how to combine individual chips into a programmable logic device that has a utilizable gate capacity equal to the sum of the gate capacities of the individual chips.

Currently, MCM programmable devices require special development tools which partition the logical functions which are to be implemented by the complete package into those performed by each of the individual chips, taking into account the limited interconnect capacity between the chips. This type of tool is required in addition to the regular development tools used to design an individual chip. However, even with such special design tools, overall logic gate utilization in the MCM package is lower than could be obtained for a single chip having the same gate capacity. This is due to the limited number of interconnections possible and the resultant I/O bottlenecks between the individual chips.

What is desired is an architecture for a large gate capacity programmable device in which the cost of the semiconductor material increases linearly with gate capacity, and which maintains a constant gate utilization percentage as the total gate capacity increases.

SUMMARY OF THE INVENTION

The present invention is directed to a high gate capacity programmable module for which the semiconductor material cost increases linearly with gate capacity. The device is manufactured by taking a single device having an extendible architecture and utilizing it in a packaging method based on Area Array technology. Multiple individual chips are interconnected into a single, larger device by means of this multi-chip module packaging technique. Because each individual chip is extendible, the resulting larger capacity device is functionally equivalent to the smaller devices from which it is made. The final device has substantially the same architecture, but an increased gate capacity when compared to the smaller devices.

In one embodiment of the present invention, the result is a high capacity programmable gate array having a semiconductor cost which increases linearly with the number of gates, uses the same application development tools (or a straightforward modification thereof) as individual chips, and has approximately the same gate utilization percentage as the individual chips do when they are used independently.

Further objects and advantages of the present invention will become apparent from the following detailed description and accompanying drawings.

BRIEF DESCRIPTION OF THE DRAWINGS

FIGS. 2A–2C illustrate some of the features of an extendible architecture chip suitable for use in accordance with the present invention.

DESCRIPTION OF THE PREFERRED EMBODIMENT

Figure 1:
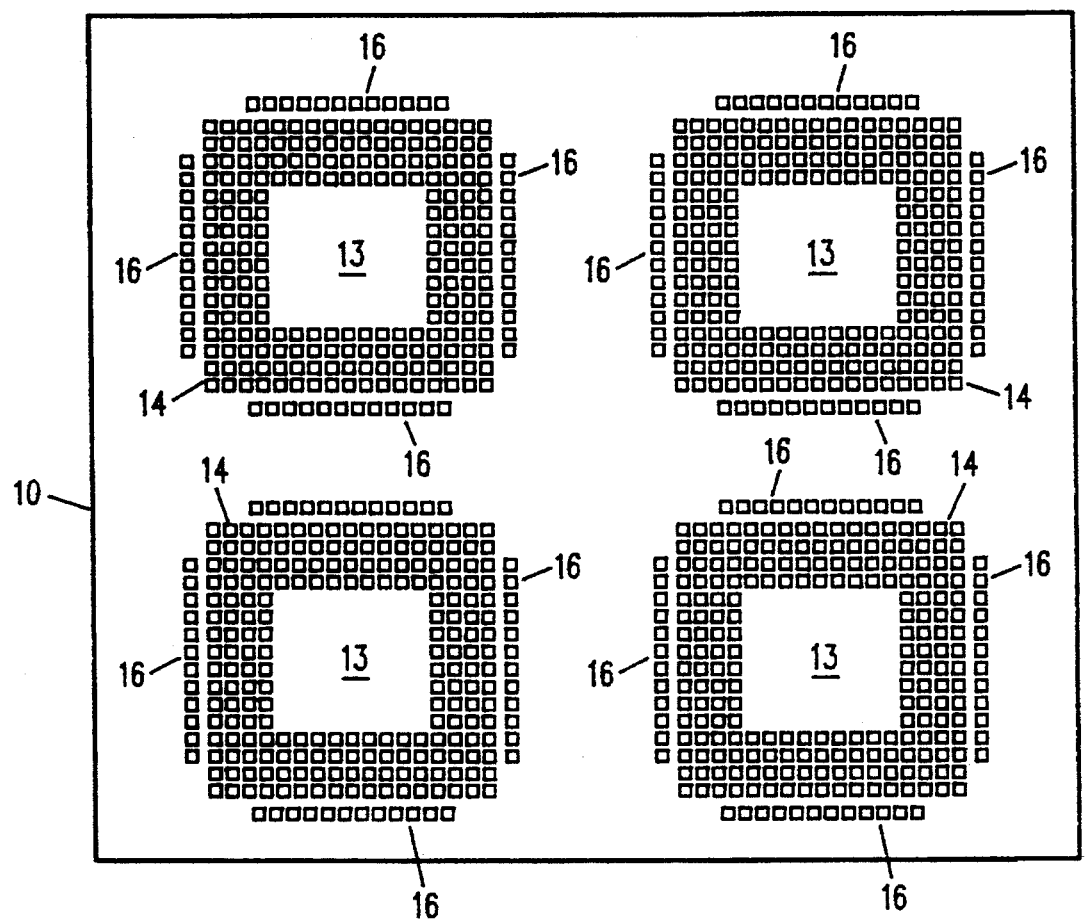
FIG. 1 is a plan view illustrating an Area Array multi-chip module substrate which is used as a mounting surface in accordance with the present invention.
Figure 3:
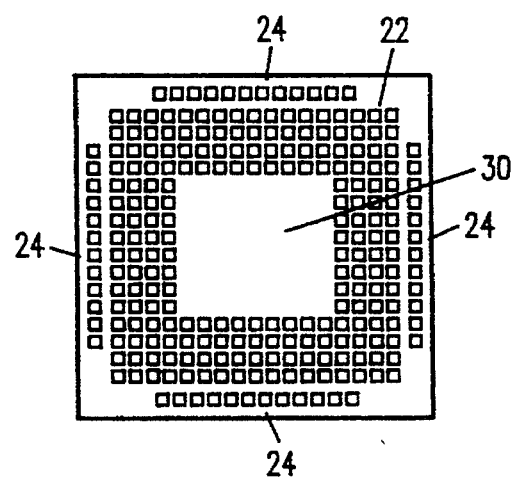
FIG. 3 is a plan view illustrating bonding pad placement for an Area Array chip to be used in accordance with the present invention.

Referring to the figures, and in particular to FIG. 1, there is shown an example of an Area Array multi-chip module substrate 10 which is used as a mounting surface in accordance with one embodiment of the present invention. As shown, substrate 10 contains four regions 13 on which individual chips (as shown in FIG. 3) may be mounted. Other configurations containing fewer or greater numbers of mounting regions are also possible and are included within the invention described herein. Each mounting region 13 is surrounded on four sides by bonding pads 14 and 16 which are used to electrically connect the individual chips to substrate 10. The layout of bonding pads 14 and 16 shown in FIG. 1 is designed to allow a sufficient number of interconnections to be made to each chip so that the four chips (in this example) can be interconnected in a manner that allows the final four chip module to have a functional capacity equivalent to that of a single chip having a gate capacity equal to four times that of one of the component chips. Note that in this embodiment of the invention, the individual chips are of the same size and architecture.

Bonding pads 14 on different chip regions 13 are interconnected by electrical paths embedded on or within substrate 10, which may be multi-layered to allow a sufficient number of interconnect paths. Bonding pads 16 are used for input/output functions for each chip and are connected through substrate 10 to the package pins of the multi-chip module.

Figure 2A:
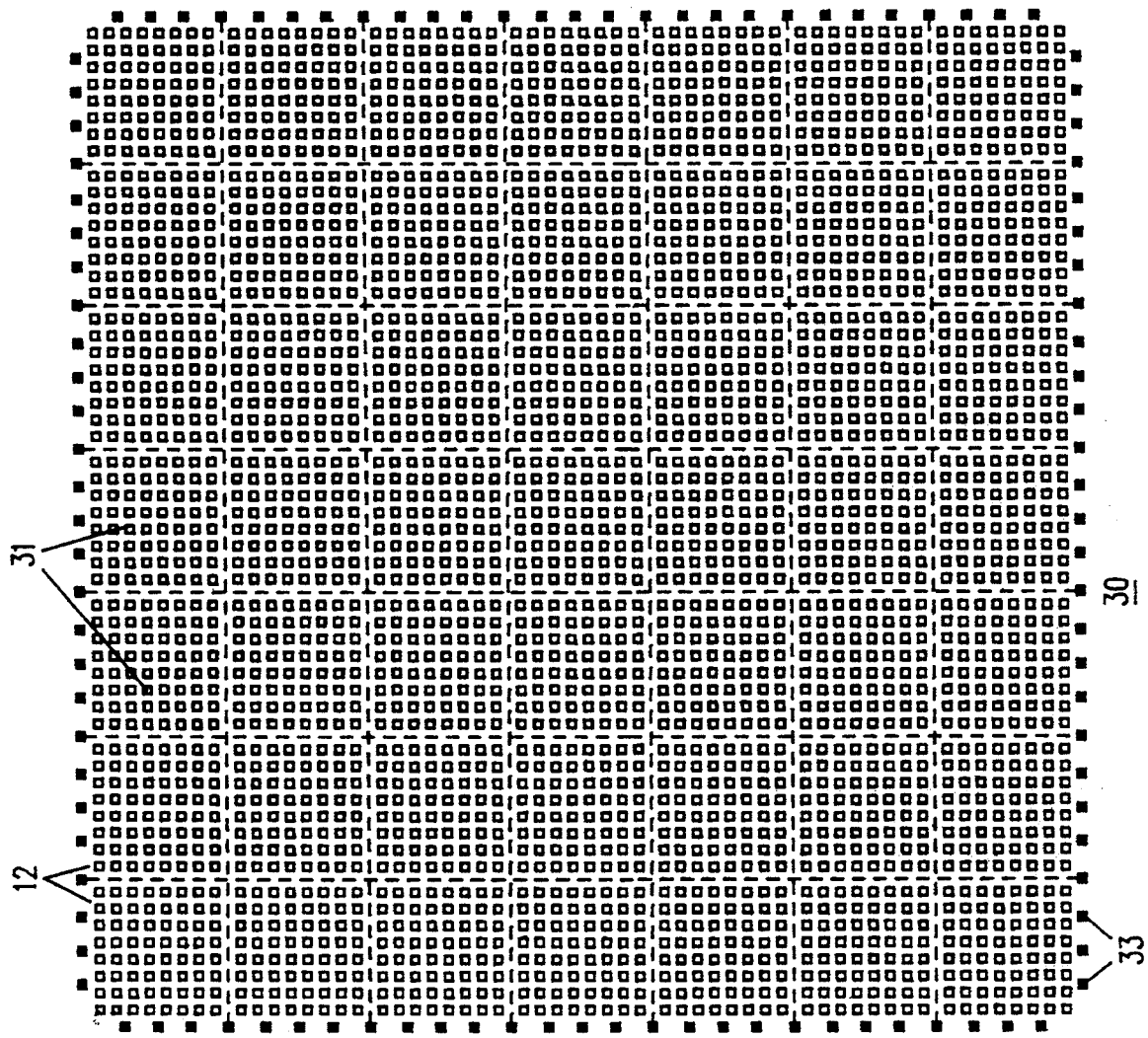
Figure 2B:
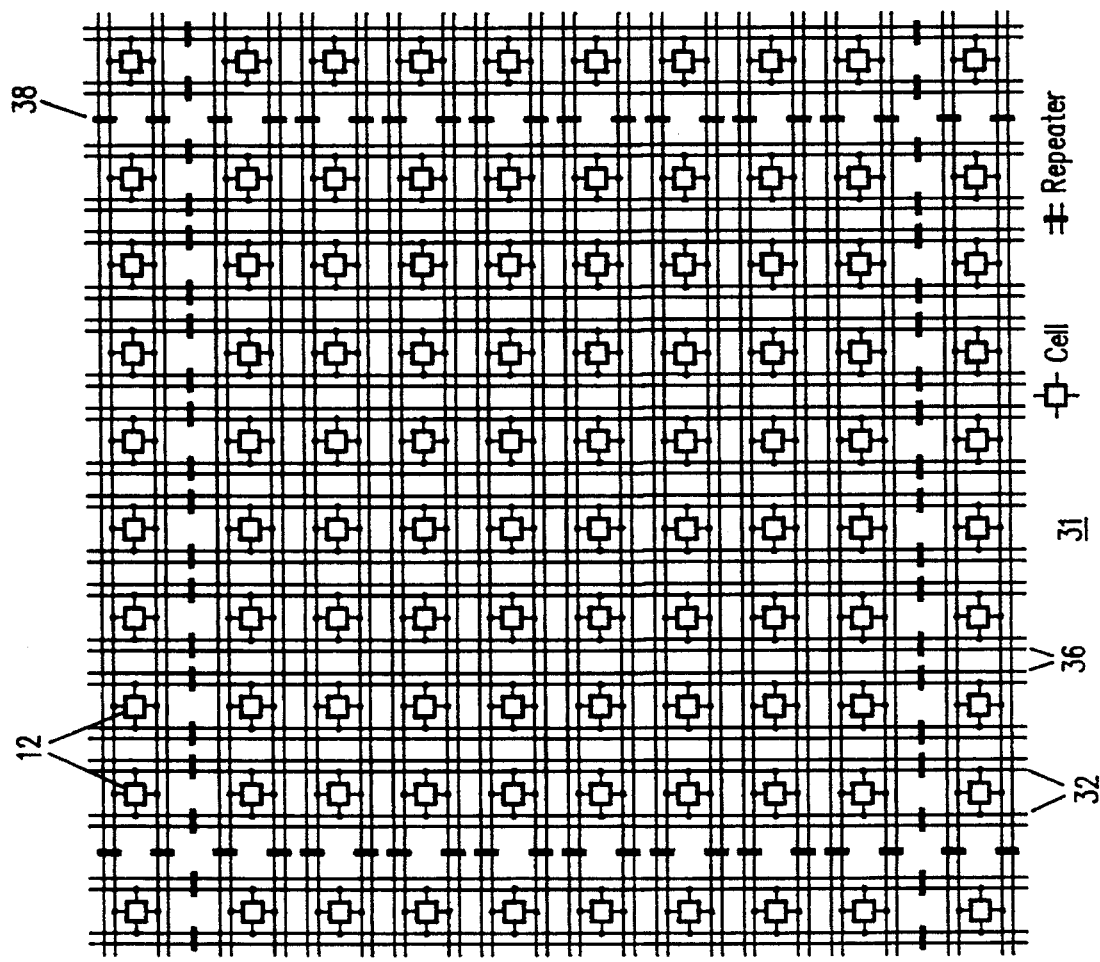

FIGS. 2A–2C illustrate some of the features of an extendible architecture device suitable for use in accordance with the present invention. By "extendible" is meant a device composed of a chip or combination of chips the architecture of which is scalable so that it may be combined with other like devices to produce a device having a higher capacity, but the same functionality and architecture as its component devices. The example of an extendible architecture shown in FIGS. 2A–2C is a configurable logic array (CLA), in particular, the CLAy family of configurable logic array chips produced by National Semiconductor Corporation of Santa Clara, Calif. The architecture and operation of the CLAy family of devices is described in U.S. Pat. No. 5,298,805, issued Mar. 29, 1994, which is assigned to the Assignee of the present application and is hereby incorporated by reference. The CLAy family of chips are a subset of the larger set of field-programmable-gate-array (FPGA) chips, some of which are also suitable for use in accordance with the present invention. Another type of device having an extendible architecture and which can be used in accordance with the present invention are mask programmable gate arrays. In addition, combinations of some types of chips can be extendible, for example FPGA and static random-access memory (SRAM) chip combinations.

As shown in FIG. 2A, the architecture of a CLAy configurable logic array chip consists of a two-dimensional array 30 formed by tiling multiple smaller arrays 31 of interconnected, programmable logic cells 12. In FIG. 2A, matrix 30 is a 7×7 array of smaller arrays 31, where each smaller array 31 is an 8×8 array of logic cells 12. Input/output (I/O) drivers 33 located on the edges of matrix 30 assist in sending signals into or out of array 30. The individual logic function and the active inputs and outputs of each logic cell 12 are determined by parameter memory bits and logic gates within the cell, rather than by physically customizing the array during manufacture. Thus, the individual cell functions and the interconnections between cells are field programmable which provides a wide variety of functions. The greater the number of cells in the array, the greater the functional capacity of the CLAy device.

A CLAy may be viewed as an array of programmable logic cells on which a flexible bussing network is superimposed. FIG. 2B is a close-up view of one of the 8×8 arrays 31 of logic cells 12 which are contained in array 30. Although logic cells 12 can be used for routing signals, this can result in unacceptably long delays when done over long distances. To address this problem, the interconnections between neighboring cells 12 are augmented with two types of programmable busses: local and express. Thus, connections between individual cells 12 in arrays 30 and 31 are accomplished by buses or by direct connections between adjacent cells.

As shown in FIG. 2B, in the CLAy array local busses 32 provide connections between the array of cells and the bussing network. Each local bus 32 is connected to every cell 12 in its column or row, thus providing every cell in the array with read/write access to the local bus system.

Express buses 36 provide higher speed transmission of signals and are not connected to every cell. Express busses 36 are designed to speed up signal transfers within arrays 30 and 31, and are the fastest way to cover straight-line distances spanning many cells.

There are two buses of each type described above for each row and each column of logic cells 12 in arrays 30 and 31. Connective units called repeaters 38, are spaced every eight cells 12 and divide each bus into segments spanning eight cells 12. Repeaters 38 are aligned into rows and columns, thereby partitioning array 30 into smaller arrays 31 containing 8×8 blocks of cells 12 called "superblocks". Repeaters 38 serve as programmable switches and can be programmed to provide various connecting functions between similar or different bus types.

As shown in FIG. 2C, each logic cell 12 receives inputs from and provides outputs to its four adjacent neighbors. Thus, each logic cell 12 in array 31, other than those on the periphery, receives eight inputs from and provides eight outputs to its North (N), East (E), South (S), and West (W) neighbors. These sixteen inputs and outputs are divided into two types, "A" and "B", with an A input, an A output, a B input and a B output for each neighboring cell 12. Between two different cells 12, an A output is always connected to an A input and a B output is always connected to a B input.

FIG. 3 shows an example of the bonding pad layout for the "extendible" chip having an architecture shown in FIGS. 2A–2C, to enable it to be mounted on substrate 10 and used in accordance with the present invention. Note that the number of pads 22 and 24 shown in FIG. 3 and the number of pads 14 and 16 surrounding each mounting region 13 of FIG. 1 should correspond to the number of interconnections required for interconnecting one chip or matrix 30 to other similar matrices of logic cells 12 in a manner consistent with the previously given definition of an extendible architecture.

In accordance with the present invention, bonding pads 22 and 24 of chip 30 are electrically connected to bonding pads 14 and 16 of a mounting region 13 of substrate 10 by means of flip-chip mounting techniques. Bonding pads 22 and 24 are electrically connected to chip 30 and have solder bumps or contacts on them to facilitate use of the flip-chip mounting technique. Each bonding pad corresponds to one of the possible connections on each side of a CLAy chip 30, such as that shown in FIG. 2A. The number and placement of bonding pads 22 depends upon the number of connections needed to interconnect the individual chips which are to be combined (for example, 8 per row or column for the CLAy device shown in FIG. 2C), and hence is a function of the chip architecture and capacity. The number of bonding pads 24 depends on the I/O requirements of the multi-chip module.

FIG. 6 illustrates in detail how the chip architecture of FIGS. 2A–2C can be modified to produce an extendible architecture. The figure shows the modifications needed for two cells 12 which are on the edge of a chip, where the chip is composed of an array of such cells. A similar modification would be used for other cells 12 which are on the edge of a chip.

As indicated in the figure, a bond pad 40 is connected to each possible connection of the cells 12 on the edge of the chip. In the example shown, this corresponds to 8 bond pads 40 for each cell 12 on the edge of the chip. By having one bond pad 40 for each possible cell connection (signal transmission line) at the edge of a chip, edge cells 12 on two different chips may be connected through their bond pads in a manner which allows them to function as a single, larger cell. This acts to interconnect two chips by means of the chips' edge cells to produce a larger chip having the same architecture and logical operation as the component chips. Thus, the original chip has been modified to have an extendible architecture by the addition of bond pads 40. Repeater elements 42 may be connected to the bus lines extending from edge cells 12 to provide the same connective functions as the repeaters described with reference to FIGS. 2B–2C.

Multiple chip configurable logic arrays based on the CLAy architecture (or other extendible chip architectures) are constructed by "tiling" identical chips or combinations of chips to produce rectangular arrays of arbitrary dimensions. In the CLAy architecture, there are four connections between each cell 12 and each of its four immediate neighbors, as shown in FIG. 2C, and two connections between each of the two repeaters 38 associated with each row or column of cells 12 and their connecting repeaters, as shown in FIGS. 2B and 2C. Each cell is approximately 130 microns on a side when fabricated with 0.8 micron CMOS technology, resulting in a 16 micron interconnect pitch requirement. Presently achievable wire bonding pitches are approximately 100 microns, which explains why such techniques are unsuitable for use in the present invention.

In the case of interconnecting multiple individual CLAy arrays 30 of the type illustrated in FIG. 2A, 8×8×7=448 chip-to-chip inter-connections are required on each chip edge to make all the interconnections necessary between cells and repeaters in corresponding rows and columns on a chip's edges. By using the type of packaging technology described in this application, these interconnections can be made. This produces a functionally "seamless" extension of the basic single chip architecture and allows the production of cost efficient, high capacity gate arrays. The term "seamless" is meant to refer to the fact that the result of combining the smaller chips is to produce a chip which is functionally indistinguishable from a single, larger chip.

It is also possible to use only a subset of the total number of possible chip-to-chip interconnections when combining individual chips. Although this would not produce a seamless extension of the single chip architecture, it may still provide a more cost effective way (as opposed to using a single larger chip) of obtaining increased functional capacity for some applications.

Figure 4A:
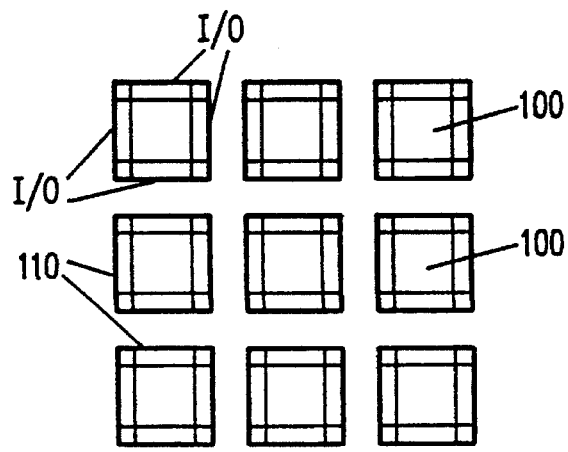
FIGS. 4A–4C illustrate three alternatives for providing I/O buffer circuitry to an embodiment of the present invention consisting of a 3×3 array of programmable logic chips.
Figure 4B:
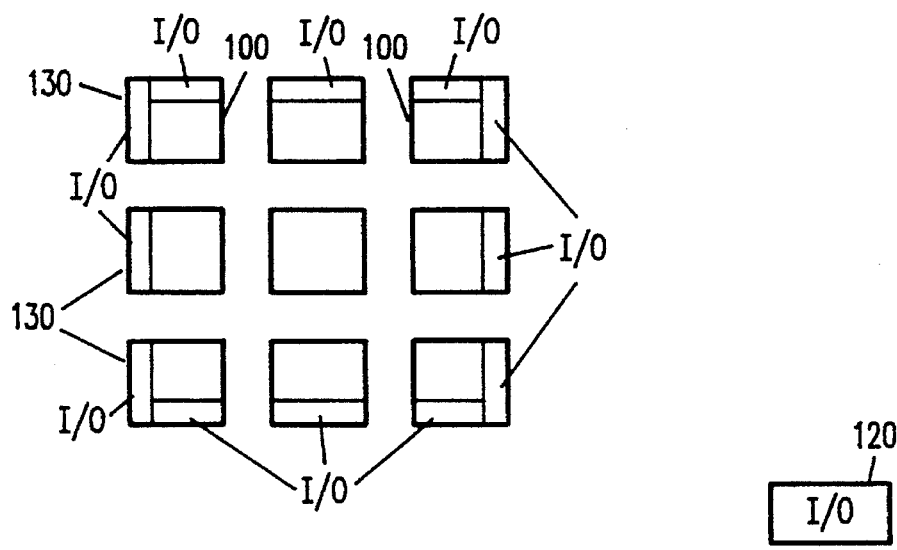
Figure 4C:
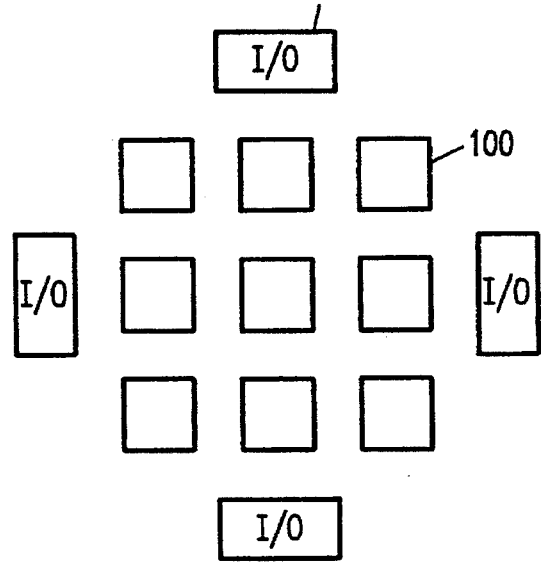

In designing chips for use in accordance with the present invention, the designer will likely need to consider the trade-offs between the required surface area of the semiconductor material and the required number of chip layout designs. FIGS. 4A–4C illustrate alternative designs for providing I/O buffer circuitry to an embodiment of the present invention consisting of a 3×3 array of programmable logic chips, and the trade-offs associated with those designs.

In order to minimize the number of chip layout designs required to support the seamless extension described in this application, each individual tile 100 can be designed having I/O buffers 110 on each of its four die edges, as shown in FIG. 4A. This requires only one chip layout design, thereby reducing design and mask making costs, and providing maximum flexibility in terms of chip to package I/O connections. However, it maximizes the semiconductor surface area required per tile. Alternately, as shown in FIG. 4C, separate I/O chips 120 which are not located on the individual tiles can be used. A separate I/O chip provides an interface between the individual extendible tiles 100 and the package pins, thereby removing the necessity of having a package I/O driver on each edge of the tile. This minimizes the semiconductor material surface area required per tile, but requires two chip layout designs.

Another alternative is shown in FIG. 4B, in which one or more I/O drivers 130 are placed on each chip 100 located on an edge of the array in order to provide I/O connections between the chip and the package pins. The number of drivers required depends upon the chip's position within the array. This approach requires at least three chip layout designs, one for each possible chip orientation with respect to the full array, but has the benefit of minimizing the total semiconductor material surface area of the array in some applications.

In accordance with the present invention, an important benefit of the combination of an extendible device architecture and Area Array MCM packaging methods is that the silicon cost of a programmable logic device fabricated in this manner is equal to the cost of each individual chip type multiplied by the number of that chip type in the final array, summed over all types of chips used in the array. Thus, the cost increases linearly as a function of the gate capacity instead of non-linearly (for example, exponentially) as it does for single chip devices.

The reason for this benefit is that multiple smaller area chips are used to create a large capacity device instead of using a single chip with larger area. Since the yield decreases as the area increases, by reducing the area of each chip and using multiple chips the overall semiconductor yield is increased and is equal to the value of the yield for a single, smaller chip.

For example, a device having 60K logic gates can be fabricated by interconnecting four extendible architecture chips, each having a capacity of 15K gates. Relative to the size of the 60K gate single chip discussed previously (2.5 cm on a side), each of the four component chips should be square and approximately 1.25 cm on a side. This means that each chip would have an area of 1.56 cm$^2$. However, a 15 k gate die which is to be combined with other identical dies into a larger device will have a surface area slightly greater than this owing to the additional area required for the I/O drivers and their connections to the die. Therefore, instead of assuming an area of 1.56 cm$^2$ for each die, a value of 1.8 cm$^2$ will be assumed. Based on the yield formula given in (1) and an assumed defect density (DD) of 1 per cm$^2$, the yield would be 0.165 or 16.5%. Assuming 80 die per wafer and that a wafer of silicon six inches in diameter costs approximately $1,000, this yield gives a silicon cost per die of approximately $75, and a silicon cost per 60K device of $300.

If a defect density of 0.5 per cm$^2$ is used, the yield obtained from equation (1) increases to 40.7%. This yield gives a silicon cost per die of approximately $30.71 and a silicon cost per 60K device of $123. Compared to the costs of $31,250 for a defect density of 1 per cm$^2$ or $1,420 for a defect density of 0.5 per cm$^2$, which were calculated previously for the fabrication of a single chip having the same gate capacity, this clearly represents an enormous savings in the cost of the semiconductor material. Even with the additional multi-chip packaging costs of about $100 per unit, the overall cost of the multi-chip device is still much lower.

Figure 5:
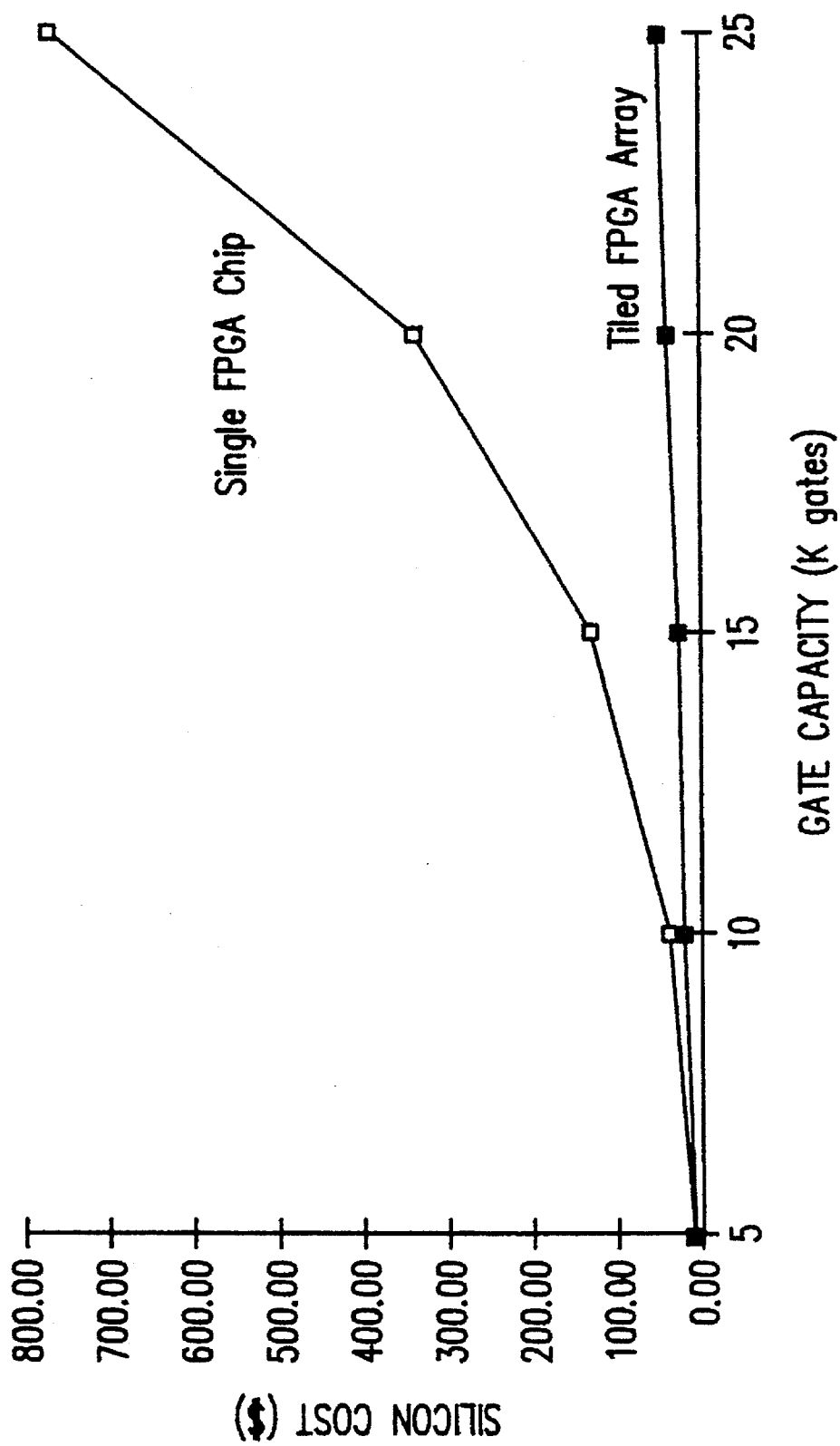
FIG. 5 is a graph illustrating the approximate cost of the semiconductor material used to fabricate a programmable gate device as a function of the gate capacity for both a single chip and a multi-chip array, based on yield equation (1).
Figure 6A:
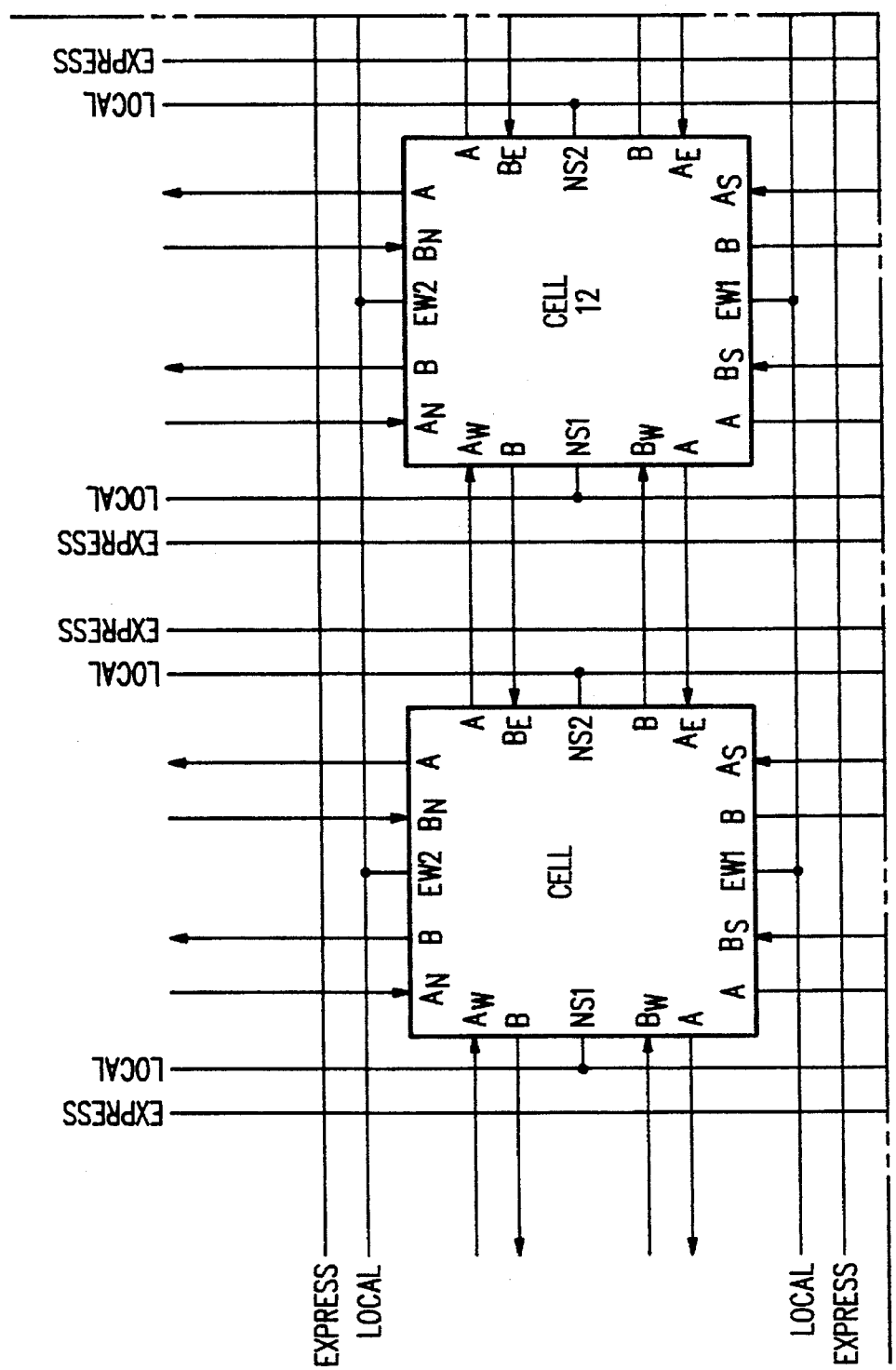
FIG. 6 illustrates in detail how the chip architecture of FIGS. 2A–2C can be modified by the addition of bonding pads in order to produce an extendible architecture.
Figure 6B:
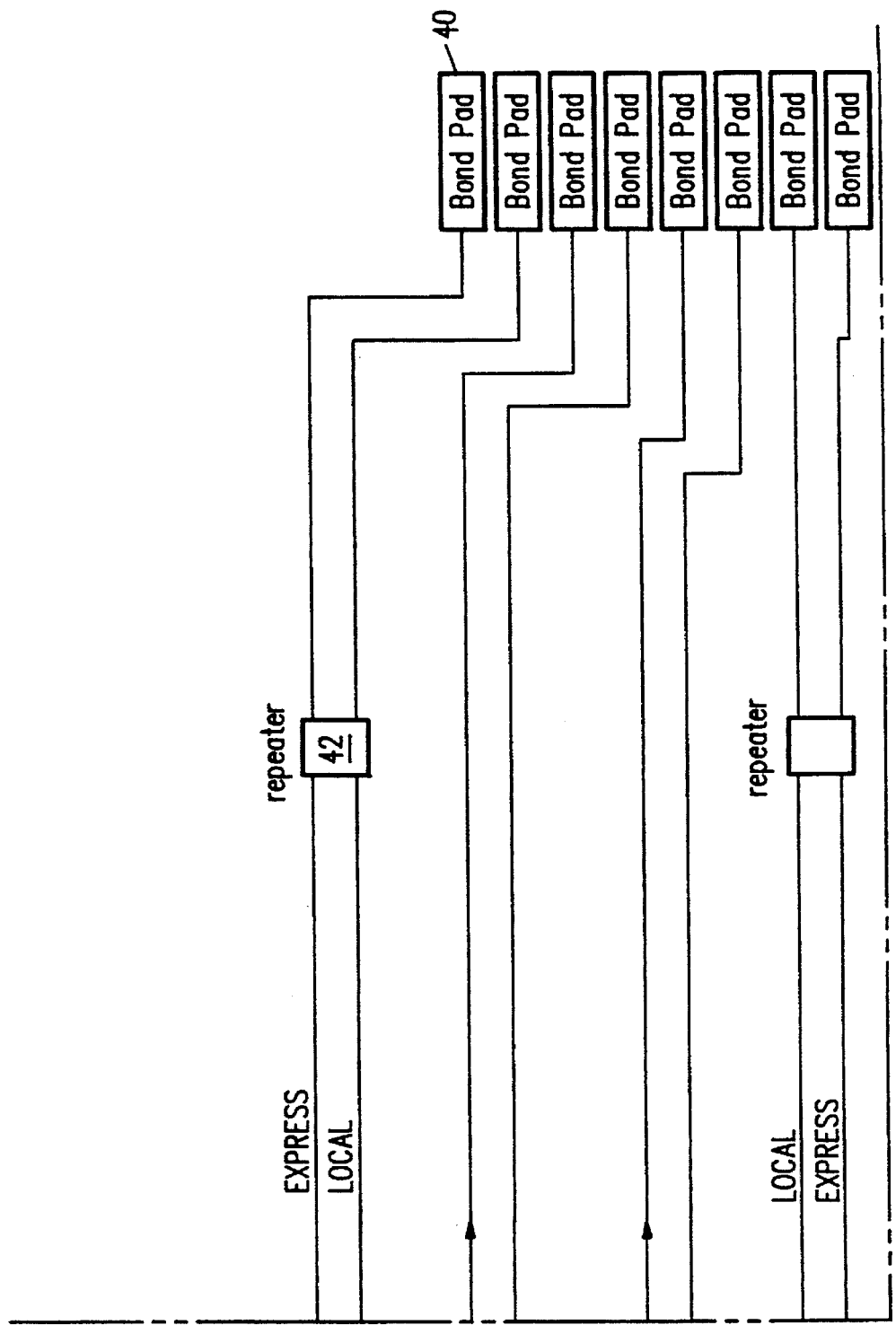
Figure 6C:
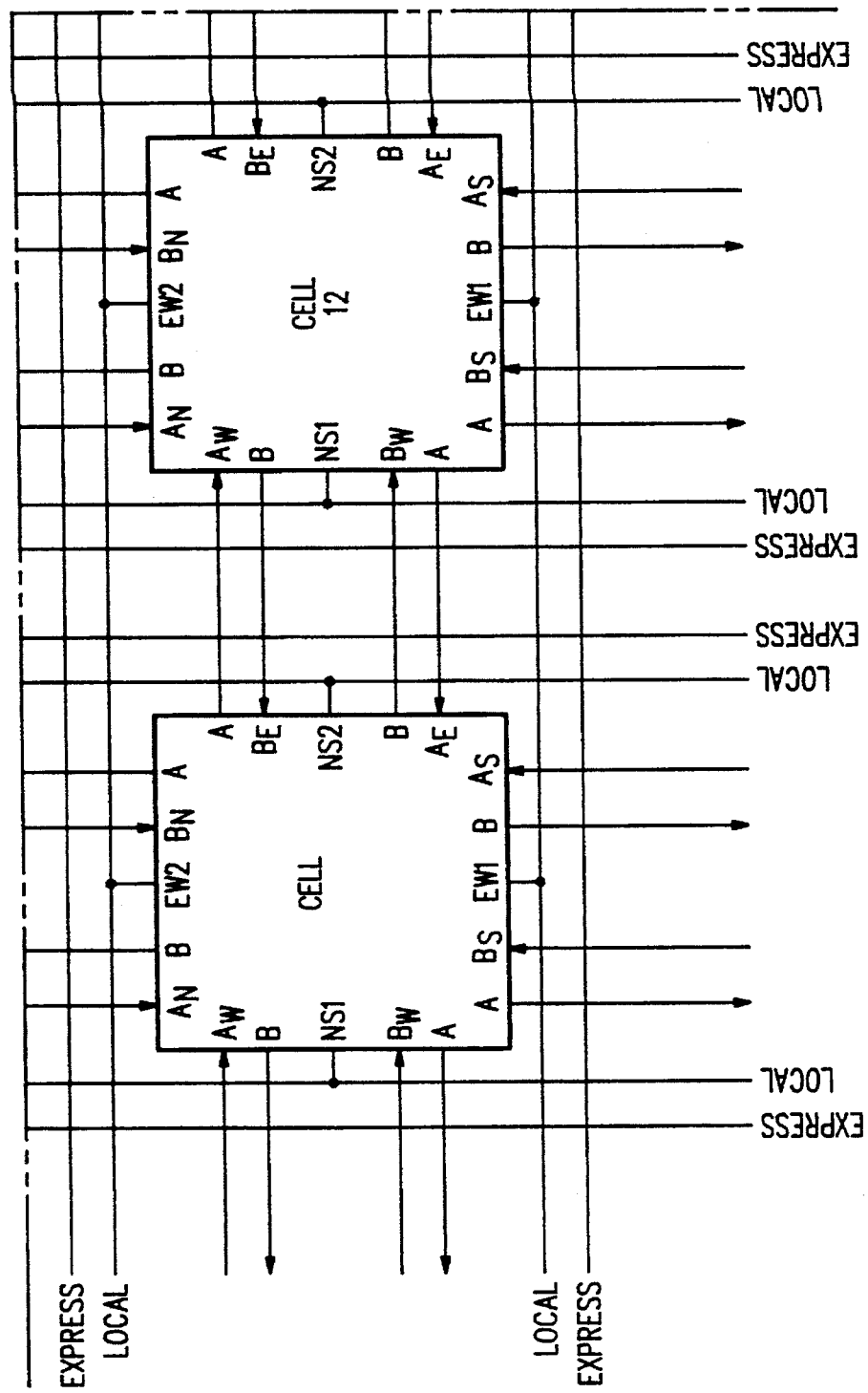
Figure 6D:
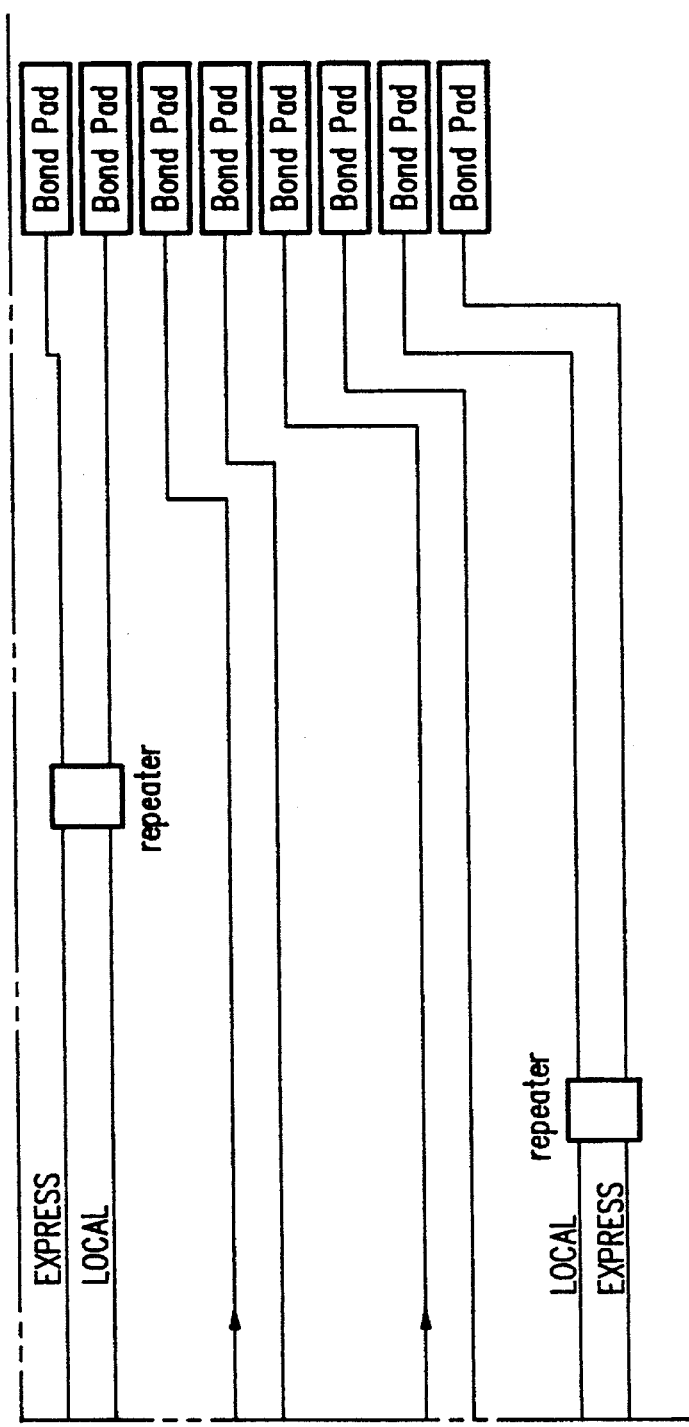

This trend is shown more clearly in FIG. 5, which is a graph illustrating the approximate cost of the semiconductor material used to fabricate a programmable gate device as a function of the gate capacity, based on the yield formula given in (1), for both a single chip and a multi-chip array. A defect density of 0.5 per cm$^2$ has been assumed in constructing FIG. 5. As is shown, the silicon cost increases rapidly for a single chip as the gate capacity increases, whereas the silicon cost for a tiled array increases only linearly with the increase in gate capacity. Further cost reductions may be obtained by optimizing the size of the individual chips based on package and substrate costs and yield considerations and Area Array interconnect limitations.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An extendible semiconductor based system, comprising:

a substrate having substrate bonding pads for the mounting of lower capacity logic arrays, the substrate bonding pads serving to electrically connect the lower capacity logic arrays to the substrate and to each other through interconnections on or within the substrate;

a plurality of lower capacity logic arrays mounted on the substrate to combine them into a higher capacity logic array, wherein each of the lower capacity logic arrays has an extendible architecture which includes a logic array bonding pad corresponding to each line which serves to propagate a signal entering or exiting an edge of the array, the logic array bonding pads on the edge of the array being connected to a corresponding substrate bonding pad, thereby serving to interconnect each line which propagates a signal entering or exiting the edge of a first array to a corresponding line of a second array; and a plurality of input/output bonding pads which electrically connect the lower capacity logic arrays to external pins on a mounting package, whereby a high capacity logic array having a higher capacity and the same functionality and architecture as the lower capacity logic arrays, and a semiconductor cost which increases substantially linearly with increasing capacity is produced.

2. The extendible system of claim 1, wherein the lower capacity logic arrays include programmable gate arrays.

3. The extendible system of claim 2, wherein the programmable gate arrays include input/output drivers.

4. The extendible system of claim 2, wherein the programmable gate arrays include mask programmable gate arrays.

5. The extendible system of claim 2, wherein the programmable gate arrays include field programmable gate arrays.

6. The extendible system of claim 1, further comprising:

an input/output chip which provides an interface between the lower capacity logic arrays and the external pins on the mounting package.

7. The extendible system of claim 1, wherein the lower capacity logic arrays include programmable gate arrays and memory chips.

8. The extendible system of claim 7, further comprising:

a programmable connective switch interconnected to the lower capacity logic arrays and used to interconnect a first lower capacity logic array to a second lower capacity logic array.

9. The extendible system of claim 1, wherein the lower capacity logic arrays include programmable gate arrays and programmable connective switches.

* * * * *